United States Patent [19]

Jonkers et al.

[11] Patent Number: 5,081,065

[45] Date of Patent: Jan. 14, 1992

[54] METHOD OF CONTACTING SILICIDE TRACKS

[75] Inventors: Alexander G. M. Jonkers; Christopher A. Seams, both of Eindhoven, Netherlands; Harald Godon, Tornesch, Fed. Rep. of Germany; André Stolmeijer, Eindhoven, Netherlands

[73] Assignee: U.S. Philips Corporation, New York, N.Y.

[21] Appl. No.: 621,116

[22] Filed: Nov. 30, 1990

[30] Foreign Application Priority Data

Dec. 27, 1989 [NL] Netherlands .................. 8903158

[51] Int. Cl.$^5$ ........................................ H01L 21/283
[52] U.S. Cl. ..................... 437/200; 437/193; 437/228; 148/DIG. 19
[58] Field of Search .............. 437/200, 228, 193; 148/DIG. 147, DIG. 19; 357/675, 715

[56] References Cited

U.S. PATENT DOCUMENTS 4,708,767 11/1987 Bril ............................... 437/18
4,873,204 10/1989 Wong et al. ................... 437/193

OTHER PUBLICATIONS van Houtum, H. J. W. et al., "TiSi$_2$ Strap Formation . . .," J. Vac. Sci. Technol. B6(6), Nov./Dec. 1988, pp. 1734-1739.
Fukumoto, M. et al., "Titanium Silicide Interconnect . . .," IEEE Trans. Elec. Dev., vol. 35, No. 12, Dec. 1988, pp. 2328-2332.

Iyer, S. et al., J. Electrochem. Soc., vol. 132, No. 9, Sep. 1985, pp. 2240-2245.
Alperin, M. E., IEEE J. Solid-State Circuits, vol. SC-20, No. 1, Feb. 1985, pp. 61-69.

Primary Examiner—Brian E. Hearn
Assistant Examiner—T. N. Quach
Attorney, Agent, or Firm—Paul R. Miller

[57] ABSTRACT

Disclosed is a method of contacting a metal silicide pattern on an integrated semiconductor circuit which is provided with a planarized dielectric layer. A silicide-forming metal layer (9), preferably a titanium layer, is provided on the surface of a silicon substrate having a field oxide patter (2) which is provided with a conductor pattern (4) of silicon. A layer (10) of amorphous (a−) silicon is provided locally on this metal layer to form "straps". The entire device is heated in a nitrogen-containing atmosphere, by which the metal layer (9) is converted at least partly into metal silicide (12). A dielectric layer (13), for example of silicon oxide, is provided over the entire surface. The layer (13) is planarized and provided with contact windows (15) on the metal silicide by etching, after which a metallization (16) is provided. According to the invention, the amorphous silicon layer is provided not only at the locations of the "straps", but also under at least those contact windows which are situated above the silicon pattern (4), and preferably below all contact windows, so that a thicker silicide layer (12B) is realized below these windows and partial or substantial removal by etching of the metal silicide in the "shallow" contact windows is prevented.

6 Claims, 1 Drawing Sheet

METHOD OF CONTACTING SILICIDE TRACKS

The invention relates to a method of manufacturing a semiconductor device having a semiconductor body comprising a field oxide pattern and a silicon region adjoining this pattern, a conductor pattern of silicon being provided on the surface of the body, the surface then being covered with a metal layer, and the portions serving for interconnection being covered with an amorphous silicon layer by means of a mask, after which the metal layer is at least partly converted into metal silicide by heating in a nitrogen-containing atmosphere and a dielectric layer is provided over the entire surface, upon which the dielectric layer is planarized, contact windows are provided in the planarized layer, and subsequently a metallization is provided on the surface and in the contact windows.

BACKGROUND OF THE INVENTION

Such a method is described in the article by H. J. W. van Houtum et al. in Journal of Vacuum Science Technology, B G(G), November/December 1988, pp. 1734–1739.

Advanced techniques are used for contacting and interconnecting elementary components in modern manufacturing technology for integrated semiconductor circuits with high packing densities, in which very large numbers of semiconductor circuit elements of very small dimensions are provided on a semiconductor slice or "chip". These techniques render it possible to manufacture contacts and interconnections of a very small width but low electrical resistance in a reproducible manner.

For this purpose, a method as described in the article referred to above is mostly used, in which a conductor pattern of polycrystalline silicon is converted over at least part of its thickness into metal silicide, having a considerably lower resistance than silicon. If metal silicide interconnections (usually called "straps") are to be formed also on the field oxide, the metal present on the oxide is coated with a layer of amorphous silicon in the relevant locations.

The surface with the silicide pattern is then coated with a dielectric layer which consists of, for example, pyrolytically deposited silicon oxide obtained through decomposition of gaseous silicon compounds. This dielectric layer, which is not flat owing to the presence of level differences on the surface, is then planarized by means of known photoresist and back-etching techniques. The required contact windows are subsequently etched into the planarized dielectric layer.

Since the distance from the surface of the planarized dielectric layer to the underlying metal silicide is not the same in all spots, than above the silicon region comprising the active semiconductor zones and bounded by the field oxide, the contact windows will be of unequal depth, so that the etching time for the "deep" contact windows will be much longer than for the "shallow" ones. Since it is the object to manufacture all contact windows during the same etching step, the metal silicide in the "shallow" contact windows will be exposed to the etching agent for an unnecessarily long time. The result of this is that, even in an etching process of comparatively great selectivity, the metal silicide underneath the "shallow" contact windows will disappear completely or almost completely, which increases the contact resistance in these contact windows to an unacceptable degree.

SUMMARY OF THE INVENTION

The present invention has for its object inter alia to provide a method by which all contact windows on the metal silicide can be provided in the same etching step without the introduction of additional aligning and masking steps and without substantially increasing the contact resistance below the "shallow" contact windows.

The invention is based inter alia on the recognition that this object can be achieved by adapting in a suitable manner the mask used for forming the straps.

According to the invention, a method of the kind described in the opening paragraph is for this purpose characterized in that the amorphous silicon layer is also provided on the metal layer by means of the mask below at least the contact windows which are to be formed above the silicon conductor pattern.

By application of the method according to the invention it is achieved that the metal silicide below at least the shallower contact windows is given a considerably greater thickness. In fact, heating in a nitrogen-containing atmosphere, which is necessary to prevent lateral diffusion of silicon atoms through the (usually polycrystalline) metal film and thus to prevent undesirable short-circuits, converts part of the non-coated metal into a metal nitride, which is later removed. The metal coated with amorphous silicon, on the other hand, is not converted into nitride, so that the metal silicide in situ is given a considerably greater thickness. The result is that the silicide underneath the shallow contact windows, which is exposed to the etching agent for a comparatively long period, is etched away only for part of its thickness during etching of the contact windows, so that the contact resistance remains very low.

Since it is sufficient for application of the method according to the invention to adapt the mask which is used for forming the straps in such a way for defining the amorphous silicon layer that the amorphous silicon layer is also present below the contact windows, it is not necessary to interpose any extra masking or etching step.

Preferably, the amorphous silicon layer is provided below all contact windows situated above the metal layer, and also above the monocrystalline silicon region adjoining the field oxide.

The metal used may be formed by any heat-resistant metal which forms a silicide, for example, tungsten, molybdenum, platinum, cobalt, etc. The invention is of particular importance in the application of titanium. This metal is widely used because of its low resistivity and its favourable technological characteristics such as its easy etching, but the etching selectivity of silicon oxide relative to titanium silicide is not particularly great in the known etching processes. By means of the invention, titanium can now be used without disadvantages also in the presence of contact windows of differing depths.

BRIEF DESCRIPTION OF THE DRAWINGS

The invention will now be described in more detail with reference to an embodiment and the drawing, in which.

The Figures are purely diagrammatical and not drawn to scale, the dimensions in thickness direction being particularly strongly exaggerated. Corresponding parts are generally identified with the same reference numerals in the Figures.

DESCRIPTION OF THE PREFERRED EMBODIMENTS

Figure 1:
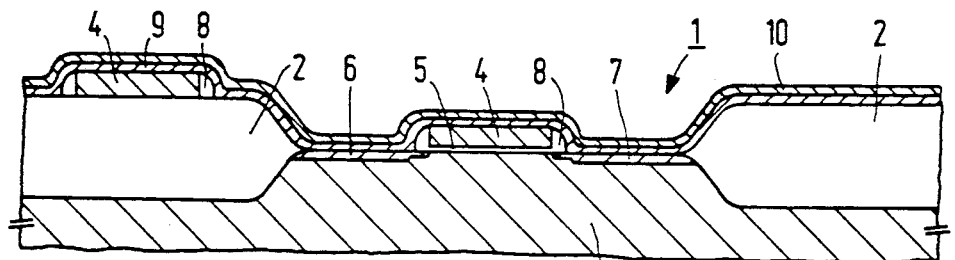
FIGS. 1, 2, 3, 4 and 5 show diagrammatically in cross-section a semiconductor device in subsequent stages of manufacture according to an embodiment of the method according to the invention.

FIG. 1 shows diagrammatically in cross-section a first stage of an embodiment of the method according to the invention.

The starting point is a semiconductor body 1 with a field oxide pattern 2 and a monocrystalline silicon region 3, in this example of the p-conductivity type, adjoining the field oxide pattern 2. The field oxide 2 may be applied in usual manner by selective oxidation of the semiconductor body. It may, as shown in the drawing, project partly outside the semiconductor surface, or it may be entirely recessed in the silicon. Furthermore, the semiconductor body in practice usually comprises many such regions, although only a single silicon region 3 is drawn in FIG. 1.

A conductor pattern 4 of polycrystalline silicon having a thickness of, for example, 300 nm is provided on the surface of the body by application of known deposition techniques. In this example, at least one insulated-gate field effect transistor is formed in the silicon region 3, the gate electrode being formed by a portion of the silicon pattern 4 which is separated from the silicon region 3 by a thin gate oxide layer 5. Another portion of the polycrystalline silicon pattern 4, which serves as an interconnection, is provided on the field oxide 2, see FIG. 1.

Subsequently an implantation with phosphorus ions at an energy of, for example, 50 keV and a dose of $4 \times 10^{13}$ ions per cm$^2$ is carried out, the gate electrode and the field oxide serving as the implantation mask.

Then the entire conductor pattern 4 is provided with a lateral insulation or spacer 8. This is done by depositing a layer of silicon oxide over the entire surface and then subjecting this layer to an anisotropic etching treatment during such a long time that only the lateral insulation 8 remains.

After this, an implantation with arsenic ions is carried out at an energy of, for example, 100 keV and a dose of $2 \times 10^{15}$ ions per cm$^2$ N-type source and drain zones 6 and 7 are thus obtained, extending to below the gate electrode.

Subsequently the surface is provided in known manner, for example by sputtering in a diode sputtering device, with a metal layer 9 during the same deposition step, which layer is in this example an approximately 35 nm thick titanium layer which can form a metal silicide with silicon, and a layer 10 of amorphous silicon (a-silicon) having a thickness of approximately 90 nm. Thus the situation of FIG. 1 is realised.

The amorphous silicon layer is then etched by means of a photoresist mask 20, for example by reactive ion etching (RIE) in a fluorine-containing plasma, which etching process has a high selectivity relative to the underlying titanium.

Figure 2:
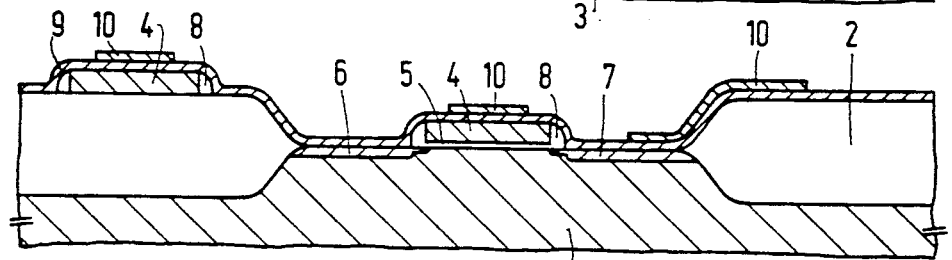

According to the invention, the etching mask 20 of such a shape is used for this that the amorphous silicon layer remains present at the locations of the interconnections and also below at least the contact windows to be formed above the polycrystalline silicon 4. The situation diagrammatically shown in FIG. 2 in cross-section is realised in this way.

After removal of the etching mask 20 the entire device is heated for a short period, for example 30 seconds, in a nitrogen-containing atmosphere at a temperature of approximately 700° C. During this the titanium which is not in contact with silicon is converted to titanium nitride 11, whereas titanium silicide (TiSi$_2$) 12 is formed in all locations where the titanium is in contact with (mono, poly, or amorphous) silicon.

Figure 3:
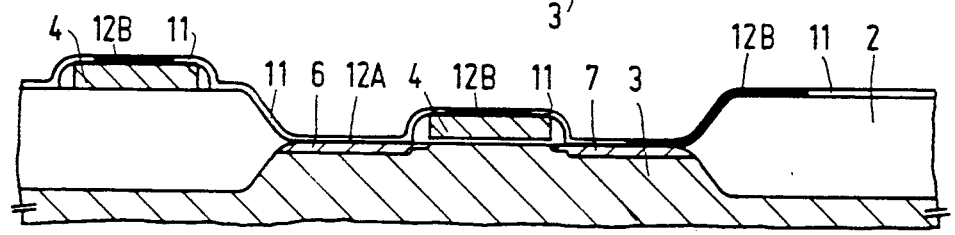

This is shown in FIG. 3, where the silicide (12A, 12B) is shown in black. The titanium situated on mono- or polycrystalline silicon not coated with a-silicon is partly converted into titanium nitride 11 (see FIG. 3). In those locations where the titanium is coated with a-silicon, no nitrogen can diffuse towards the metal, so that no titanium nitride is formed there. As a result, the titanium silicide is thicker in these locations (approximately 100 nm) than in the locations of the uncoated titanium (approximately 60 nm).

The formed titanium nitride 11 is then removed, for example in a mixture of H$_2$O$_2$/NH$_4$OH/H$_2$O. After that a further heating treatment at higher temperature (approximately 900° C.) is carried out for approximately 30 seconds in a nitrogen-containing atmosphere in order to convert the formed titanium silicide, which is in the C49 structure with a comparatively high resistivity, into the C54 structure with a low resistivity.

In this example the thickness of the amorphous silicon layer 10 is so chosen that it is completely converted into titanium silicide. If a thicker layer of a-silicon is used, the silicon remaining on the silicide will have to be removed at least at the locations of the metal silicide which are to be contacted.

Figure 4:
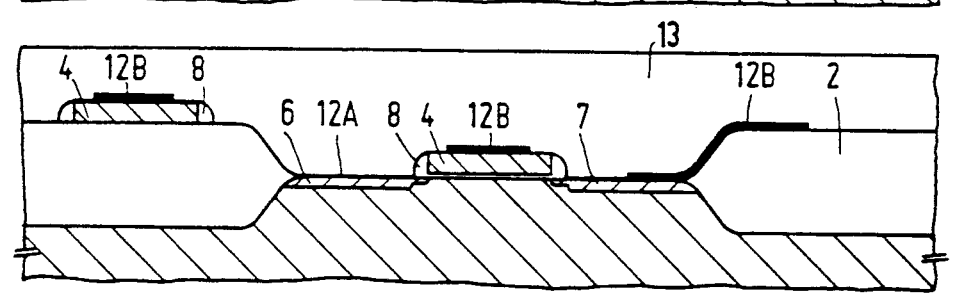

Subsequently, the entire surface is coated with a dielectric (TEOS) layer 13 of silicon oxide in usual manner, in this example by dissociation of a silicon-containing gas mixture. This layer 13 is then planarized by the application of generally used etching techniques, so that a practically flat surface is realised. The situation of FIG. 4 is obtained in this way.

Figure 5:
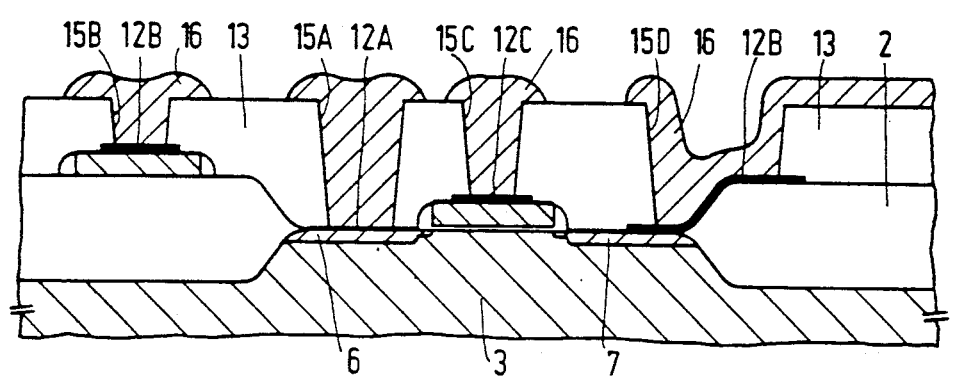

Contact windows 15 are then etched in this dielectric layer 13, see FIG. 5. Since the surface on which the layer 13 is provided is not flat, contact windows of different depths will be the result.

Considerably more time is required for etching the deep contact windows, such as 15A on the monocrystalline silicon, than for etching the less deep contact windows (15B, 15C) on the polycrystalline silicon 4 or (15D) on the silicide interconnections on the field oxide 2. As a result, the silicide below these shallow contact windows is subjected to the etching medium for a comparatively long period. In spite of good selectivity of the etching process relative to the titanium silicide, the latter is nevertheless etched away over part of its thickness.

Since according to the invention the amorphous silicon layer was applied not only on the interconnections or "straps", but also under the contact windows to be provided above the polycrystalline silicon 4, the titanium silicide is still present in sufficient thickness in situ after etching in order to guarantee a low contact resistance.

In the present example it was assumed by way of illustration that the amorphous silicon layer on the source and drain zones 6 and 7, where no overetching takes place, was not or, as the case may be, only partly provided. The a-silicon, however, is advantageously provided under all contact windows situated above the metal layer.

Finally, a metallization 16 is provided on the surface and in the contact windows, see FIG. 5, by the application of known techniques, for example by vapour deposition of aluminum followed by a photolithographic etching process.

The invention is not limited to the embodiment described above, but is applicable to all analogous cases in which a planarized dielectric layer is used.

This dielectric layer may then consist of other materials than silicon oxide. Moreover, alternative deposition processes may be used. Instead of titanium, other heat-resistant silicide-forming metals may be used, such as platinum, tungsten, molybdenum, cobalt, etc.

We claim:

1. A method of manufacturing a semiconductor device comprising the steps of:
    (a) forming at least one monocrystalline silicon region and adjoining field oxide pattern on a surface of a semiconductor body,
    (b) forming a conductor pattern of polycrystalline silicon on said at least one silicon region and adjoining field oxide pattern,
    (c) covering said at least one silicon region and said adjoining field oxide pattern and said conductor pattern with a metal layer,
    (d) covering said metal layer with an amorphous silicon layer,
    (e) forming selected portions of said amorphous silicon layer on said metal layer and then removing remaining portions of said amorphous silicon layer,
    (f) converting said selected portions and underlying metal layer portions at least partially into metal silicide layer portions of different thicknesses by heating in a nitrogen-containing atmosphere and then removing remaining portions of said metal layer, said different thicknesses being determined by heights of said selected portions above said surface of said semiconductor body,
    (g) forming a planarized dielectric layer over said semiconductor body,
    (h) forming contact windows in said planarized dielectric layer to said metal silicide layer portions of different thicknesses by etching openings in said dielectric layer to each of said metal silicide layer portions at different heights above said surface, and
    (i) forming contact metallization into each of said contact windows to contact said metal silicide layer portions.

2. A method according to claim 1, wherein said metal silicide layer portions are formed to be thicker for greater heights above said surface of said semiconductor body.

3. A method according to claim 2, wherein said selected portions of said amorphous silicon layer and said underlying metal layer portions are completely converted into said metal silicide layer portions.

4. A method according to claim 3, wherein said contact windows are formed above all selected portions and underlying metal layer portions.

5. A method according to claim 3, wherein said metal layer is provided of titanium.

6. A method according to claim 2, wherein said metal layer is provided of titanium.

* * * * *